(12) United States Patent
Huang

(10) Patent No.: US 9,094,019 B2
(45) Date of Patent: Jul. 28, 2015

(54) LEVEL SWITCHING CIRCUIT AND METHOD FOR CONTROLLING RAIL-TO-RAIL ENABLING SIGNAL

(71) Applicant: Fairchild Semiconductor Corporation, San Jose, CA (US)

(72) Inventor: Lei Huang, Beijing (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/789,550

(22) Filed: Mar. 7, 2013

(65) Prior Publication Data

US 2013/0234774 A1    Sep. 12, 2013

(30) Foreign Application Priority Data

Mar. 7, 2012    (CN) .......................... 2012 1 0062731

(51) Int. Cl.
| | |
|---|---|
| *H03L 7/00* | (2006.01) |
| *H03L 5/00* | (2006.01) |
| *H03K 19/0185* | (2006.01) |
| *H03K 3/356* | (2006.01) |

(52) U.S. Cl.
CPC .......... *H03L 5/00* (2013.01); *H03K 19/018521* (2013.01); *H03K 3/35613* (2013.01)

(58) Field of Classification Search
USPC ................................................ 327/143, 198
See application file for complete search history.

(56) References Cited

U.S. PATENT DOCUMENTS

| | | | | |
|---|---|---|---|---|
| 4,375,663 | A | * | 3/1983 | Arcara et al. ................. 365/226 |
| 4,410,991 | A | * | 10/1983 | Lenart .............................. 714/22 |
| 4,672,585 | A | * | 6/1987 | Nollet ........................... 365/228 |

FOREIGN PATENT DOCUMENTS

| | | |
|---|---|---|
| CN | 201167229 Y | 12/2008 |
| CN | 101673136 A | 3/2010 |
| CN | 102234481 A | 11/2011 |
| CN | 202602615 U | 12/2012 |

OTHER PUBLICATIONS

"Chinese Application Serial No. 201210062731.X, First Office Action mailed Jun. 1, 2015", w/English Claims, 10 pgs.

* cited by examiner

*Primary Examiner* — Kenneth Wells
(74) *Attorney, Agent, or Firm* — Schwegman Lundberg & Woessner, P.A.

(57) ABSTRACT

This document discusses, among other things, methods for controlling a Rail-to-Rail enabling signal, including providing a first signal of an input signal of a control circuit to a level switching circuit, performing, by the level switching circuit, enabling control according to a high level and a low level of the first signal, and outputting, by the level switching circuit, a disabling signal in case of a failure of a power supply coupled to the level switching circuit. The document also discusses a circuit for controlling a Rail-to-Rail enabling signal and a level switching circuit configured to output a disabling signal properly to provide an accurate enabling control signal for equipment operated under control of an enabling control in case of the failure of the power supply.

21 Claims, 3 Drawing Sheets

101. FEED A FIRST SIGNAL OF AN INPUT SIGNAL OF A CONTROL CIRCUIT TO A LEVEL SWITCHING CIRCUIT

102. PERFORM, BY THE LEVEL SWITCHING CIRCUIT, ENABLING CONTROL ACCORDING TO A HIGH LEVEL AND A LOW LEVEL OF THE FIRST SIGNAL, AND OUTPUT, BY THE LEVEL SWITCHING CIRCUIT, A DISABLING SIGNAL IN CASE OF A FAILURE OF A POWER SUPPLY

LEVEL SWITCHING CIRCUIT AND METHOD FOR CONTROLLING RAIL-TO-RAIL ENABLING SIGNAL

CLAIM OF PRIORITY

This application claims the benefit of priority under 35 U.S.C. 119 to Chinese Patent Application Serial No. 201210062731.X, filed on Mar. 7, 2012, which is incorporated by reference herein in its entirety.

TECHNICAL FIELD

The disclosure relates to techniques for controlling an enabling signal, in particular to a method and a circuit for controlling a Rail-to-Rail enabling signal, and a level switching circuit therein.

BACKGROUND

As different operating voltages emerge for digital Integrated Circuits (IC), the need for logic level switching increasingly stands out. Level switching can vary with logic level, data bus form, or data transmitting rate. In certain examples, data bus form can include four-wire Serial Peripheral Interface (SPI), 32-bit parallel data bus, and the like. At present, there are a number of logic chips that can be used to control a Rail-to-Rail enabling signal. However, many of such logic chips stop operating when losing power, which may cause errors in the Rail-to-Rail enabling signal.

FIG. 1 illustrates an example of a circuit that can be used to control a Rail-to-Rail enabling signal, including Positive Channel Metal-Oxide-Semiconductor Field-Effect Transistors (PMOS) M1, M3, M5, M7, and M8, Negative Channel Metal-Oxide-Semiconductor Field-Effect Transistors (NMOS) M2, M4, M6, and M9, and resistors R1 and R2.

The PMOS M1 has a substrate and a source both connected to a power supply pwrin, a gate receiving an input signal in, and a drain connected to a drain of the NMOS M2 and to a gate of the PMOS M5. The NMOS M2 has a substrate and a source both connected to the power supply ground pwrn, a gate receiving an input signal in, and a drain connected to the drain of the PMOS M1 and to the gate of the PMOS M5.

The PMOS M3 has a substrate and a source both connected to the power supply pwrin, a gate receiving input signal in, and a drain connected to the resistor R1 and to a gate of the NMOS M6. The resistor R1 is connected, at one end, to the drain of the PMOS M3 and to a gate of the NMOS M6, and, at the other end, to a drain of the NMOS M4. The NMOS M4 has a drain connected to the resistor R1, a gate connected to a drain of the PMOS M5, a source connected to the power supply ground pwrn and a disabling signal providing node nrail, and a substrate connected to the power supply ground pwrn. The PMOS M5 has a substrate and a source both connected to the power supply pwrn, a gate connected to the drain of the PMOS M1 and to the drain of the NMOS M2, and a drain connected to the resistor R2, to the gate of the NMOS M4, to the drain of the PMOS M7, and to the gate of the PMOS M8. The resistor R2 is connected, at one end, to the drain of the PMOS M5 and to the gate of the NMOS M4, and, at the other end, connected to the drain of the NMOS M6. The NMOS M6 has a drain connected to the resistor R2, a gate connected to the drain of the PMOS M3, a source connected to the power supply pwrn and to the disabling signal providing node nrail, and a substrate connected to the power supply pwrn.

The PMOS M7 has a substrate and a source both connected to the power supply pwrn, a gate connected to an enabling signal providing node eni_rr, and a drain connected to the resistor R2, to the gate of the NMOS M4, to the drain of the PMOS M5, and to the gate of the PMOS M8. The PMOS M8 has a substrate and a source both connected to the power supply pwrin, a gate connected to the resistor R2, to the gate of the NMOS M4, to the gate of the NMOS M9, to the drain of the PMOS M5, and to the drain of the PMOS M7, and a drain connected to the enabling signal providing node eni_rr. The NMOS M9 has a gate connected to the source, to the power supply pwrn and to the disabling signal providing node nrail, a substrate connected to the power supply pwrn, a gate connected to the resister R2, to the gate of the NMOS M4, to the gate of the PMOS M8, to the drain of the PMOS M5 and to the drain of the PMOS M7, and a drain connected to the enabling signal providing node eni_rr. The gate of the PMOS M8 and the gate of the NMOS M9 are also connected to a signal gate.

In FIG. 1, when the voltage VCC of the power supply pwrin is normal, the enabling signal providing node eni_rr can output a corresponding Rail-to-Rail enabling control signal, such as the voltage VCC of the output power supply pwrin or the voltage Vnrail of the disabling signal providing node nrail, according to the high and low levels of the input signal in. When the power is down, the PMOS M3 and the PMOS M5 may not be in a stable state, which can cause the entire circuit to be unable to operate properly. As a result, the enabling signal output node eni_rr may be unable to reach the voltage Vnrail of the disabling signal providing node nrail, and thus may be unable to provide an accurate enabling control signal to equipment operated under the control of the enabling control.

SUMMARY

The present inventors have recognized, among other things, a method and a circuit for controlling a Rail-to-Rail enabling signal and a level switching circuit therein. A first signal of an input signal of a control circuit can be fed in a level switching circuit, wherein the level switching circuit perform enabling control according to high or low levels of the first signal, and the level switching circuit outputs a disabling signal in case of a failure of a power supply. Thus, the level switching circuit can output a Rail-to-Rail enabling or disabling signal according to high and low levels of the first signal when the power supply voltage is normal and can output a disabling signal according to a low level output into which the first signal changes in case of the failure of the power supply, thereby providing an accurate enabling control signal for an equipment operated under the control of the enabling control.

A level switching circuit can include a PMOS having a drain configured to receive a first signal of an input signal. The PMOS can be in a state of on or off according to a high level or a low level of the first signal, wherein, in case of power supply failure, the input signal is in the low level. The level switching circuit can include a resistor configured to enable a signal output node to output an enabling signal when the PMOS is on and to enable the signal output node to output a disabling signal when the PMOS is off.

A circuit for controlling a Rail-to-Rail enabling signal can include a level switching circuit configured to receive a first signal of an input signal, to perform enabling control according to a high level and a low level of the first signal, and to output a disabling signal in case of a failure of a power supply.

A method for controlling a Rail-to-Rail enabling signal can include feeding a first signal of an input signal of a control circuit to a level switching circuit, performing, by the level switching circuit, enabling control according to a high level and a low level of the first signal, and outputting, by the level switching circuit, a disabling signal in case of a failure of a power supply.

DETAILED DESCRIPTION

In an example, a first signal of an input signal of a control circuit can be fed to a level switching circuit, which can perform an enabling control according to high and low levels of the first signal and can output a disabling signal in case of a power supply failure. Specifically, when the power supply has a normal voltage, the level switching circuit can output an enabling signal according to the high level of the first signal and can output a disabling signal according to the low level of the first signal. In case of a power supply failure, the level switching circuit can output a disabling signal directly according to the low level of the first signal.

Figures 1, 2:
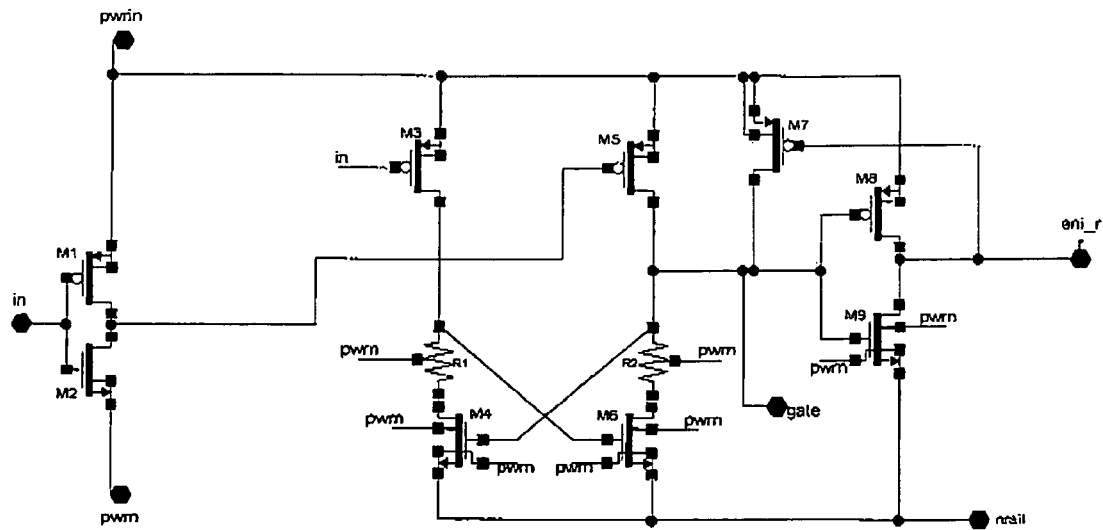
FIG. 1 is a schematic view of a circuit for controlling a Rail-to-Rail enabling signal in prior art.
FIG. 2 is a flowchart of an example method for controlling a Rail-to-Rail enabling signal according to the present disclosure.

FIG. 2 illustrates generally a flowchart of an example method for controlling a Rail-to-Rail enabling signal. At 101, the first signal of an input signal of a control circuit can be fed to a level switching circuit.

Figure 3:
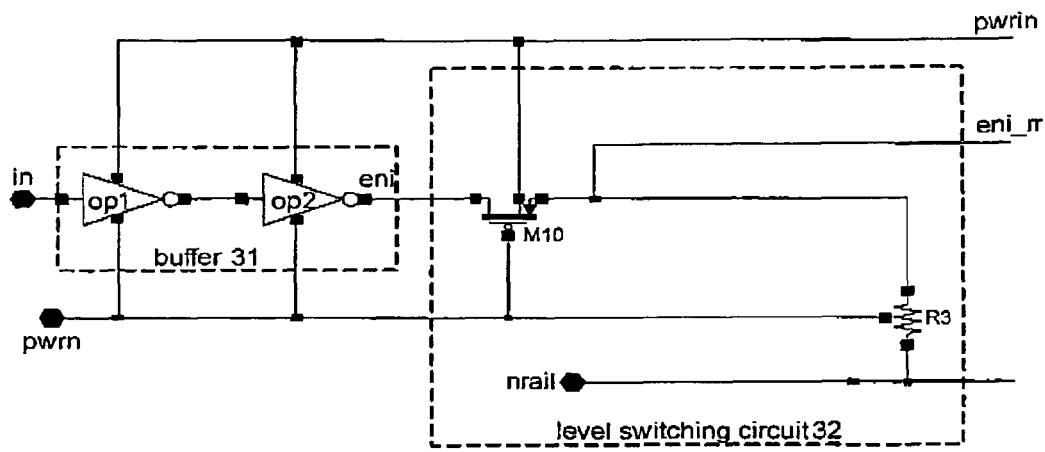
FIG. 3 is a schematic view of a circuit for controlling a Rail-to-Rail enabling signal according to the present disclosure.

As illustrated in FIG. 3, the first signal eni of the input signal of the control circuit can be acquired via a buffer 31, and the first signal eni is fed to the drain of a PMOS M10 of a level switching circuit 32. The level switching circuit 32 can include phase inverters op1 and op2. The input of the phase inverter op1 can receive the input signal in, and the output of the phase inverter op1 can be connected to the input of the phase inverter op2. The output of the phase inverter op2 can be connected to the drain of the PMOS M10 of the level switching circuit 32. The grounding legs and the power supply legs of the phase inverters op1 and op2 can be connected to a power supply pwrin and a power supply ground pwrn, respectively.

The level switching circuit 32 can include the PMOS M10 and a resistor R3, wherein the substrate of the PMOS M10 can be connected to the power supply pwrin, the drain of the PMOS M10 can be connected to the first signal eni of the input signal in, the source of the PMOS M10 can be connected to an enabling signal providing node eni_rr and the resistor R3, and the gate of the PMOS M10 can be connected to the power supply ground pwrn. R3 can be connected between the source of the PMOS M10 and a disabling signal providing node nrail.

Figure 4:
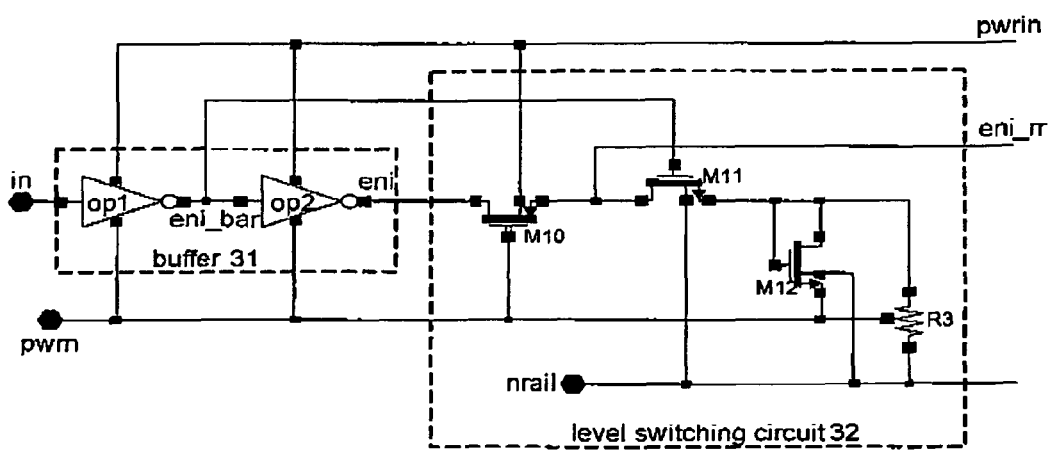
FIG. 4 is a schematic view of another circuit for controlling a Rail-to-Rail enabling signal according to the present disclosure.

In an example, at 101, a second signal of the input signal can be fed to the level switching circuit. As illustrated in FIG. 4, the second signal eni_bar of the input signal in can be acquired via buffer 31 and fed to the gate of an NMOS M11 of the level switching circuit 32. The level switching circuit 32 can include the NMOS M11 for limiting the current through resistor R3. The NMOS M11 can be arranged between the PMOS M10 and the resistor R3, wherein the substrate of the NMOS M11 can be connected to the disabling signal providing node nrail, the drain of the NMOS M11 can be connected to the source of the PMOS M10, the source of the NMOS M11 can be connected to the resistor R3, and the gate of the NMOS M11 can be connected to the second signal eni_bar of the input signal in.

The level switching circuit 32 can include an NMOS M12, wherein the substrate of the NMOS M12 can be connected to the disabling signal providing node nrail, the drain and the gate of the NMOS M12 can be connected to the source of the NMOS M11 and to the resistor R3, and the gate of the NMOS M12 can be connected to the power supply ground pwrn. The NMOS M12 can be configured to promptly pull down the level of the enabling signal output node eni_rr.

At 102, the level switching circuit can perform enabling control according to high and low levels of the first signal and can output a disabling signal in case of a power supply failure.

As illustrated in FIG. 3, assuming there is no NMOS M11, such as that illustrated in FIG. 4, for limiting the current through the resistor R3 in the level switching circuit 32, when the voltage VCC of power pwrin is normal and the input signal in is high, the first signal eni fed to level switching circuit 32 can be high VCC, the PMOS M10 can be on, and the enabling signal output node eni_rr can output the enabling signal VCC. When voltage VCC of power pwrin is normal and the input signal in is low, the first signal eni fed to level switching circuit 32 can be low (0), the PMOS M10 can be off, the level of the enabling signal output node eni_rr can be pulled down to the level Vnrail of the disabling signal providing node nrail via the pull-down resister R3, and the enabling signal output node eni_rr can output the disabling signal Vnrail.

In case of a power supply failure, the buffer 31 can stop operating, the first signal eni fed to the level switching circuit 32 can be low (0) irrespective of the voltage of the input signal in, the PMOS M10 can be cut off, the level of the enabling signal output node eni_rr can be pulled down to the level Vnrail of the disabling signal providing node nrail via the resistor R3, and the enabling signal output node eni_rr can output the disabling signal Vnrail.

When the level switching circuit 32 includes the NMOS M11 for limiting the current through the resistor R3, such as illustrated in FIG. 4, the level switching circuit 32 can perform enabling control according to high and low levels of the first and second signals.

As shown in FIG. 4, when the power supply pwrin has a normal voltage VCC and the input signal in is high, the first signal eni fed to the level switching circuit 32 is high VCC, the second signal eni_bar is low 0, the PMOS M10 is on, based on the fact that the level Vnrail of the node nrail providing the disabling signal is smaller than a negative turning-on threshold of the NMOS M11, the NMOS M11 can be on and the enabling signal output node eni_rr can output the enabling signal VCC. When the power supply pwrin has the normal voltage VCC and the input signal in is low, the first signal eni fed in the level switching circuit 32 is low 0, the second signal eni_bar is high VCC, the PMOS M10 is cut off, the NMOS M11 is on, the level of the enabling signal output node eni_rr is pulled down to the level Vnrail of disabling signal providing node nrail via the pull-down resistor R3, and the enabling signal output node eni_rr can output the disabling signal Vnrail.

In case of a power supply failure, the buffer 31 can stop operating and the first and the second signals eni, eni_bar fed in the level switching circuit 32 are low (0). The PMOS M10 can be cut off, based on the fact that the level Vnrail of the node nrail providing the disabling signal is smaller than the negative turning-on threshold of the NMOS M11, and the NMOS M11 can be on. The level of the enabling signal output node eni_rr can be pulled down to the level Vnrail of disabling signal providing node nrail via the resistor R3 and the enabling signal output node eni_rr can output the disabling signal Vnrail.

In an example, at 202, the level of the enabling signal output node eni_rr can promptly pull down via the NMOS M12 when the power supply pwrin has the normal voltage VCC and the input signal in is low. In the aforementioned method, the first signal is the positive signal of the input signal and the second signal is the inverted signal of the input signal.

To implement the method for controlling a Rail-to-Rail enabling signal as described herein, the level switching circuit 32, as shown in FIG. 3, can include the PMOS M10 and the resistor R3, wherein the PMOS M10 is configured to receive a first signal eni of an input signal in at its drain, wherein the PMOS M10 is in a state of on or off according to respective high and low levels of the first signal eni, wherein the first signal eni is low in case of a power supply pwrin failure. The level switching circuit 32 can further include the resistor R3 configured to enable an enabling signal output node eni_rr to output an enabling signal when the PMOS M10 is on and to enable the enabling signal output node eni_rr to output a disabling signal when the PMOS M10 is off.

In an example, the specific connection relation of the PMOS M10 and resistor R3 is as follows. The substrate of the PMOS M10 is connected to the power supply pwrin, the drain of the PMOS M10 is connected to the first signal eni of the input signal in, a source of the PMOS M10 is connected to the resistor R3, and a gate of the PMOS M10 is connected to a power supply ground pwrn. The resistor R3 is between the source of the PMOS M10 and a disabling signal providing node nrail and the level of the disabling signal providing node nrail is no higher than the power supply ground pwrn.

As shown in FIG. 4, the level switching circuit 32 can further include NMOS M11 configured to receive a second signal eni_bar of the input signal in at its source and can control the NMOS M11 to be in a state of break-over and limit the current through the resistor R3 when the power supply pwrin either has a normal voltage or is down. The NMOS M11 can be arranged in between the PMOS M10 and the resistor R3, and the substrate of the NMOS M11 can be connected to a disabling signal providing node nrail, the drain of the NMOS M11 can be connected to the source of the PMOS M10, the source of the NMOS M11 can be connected to the resistor R3, and the gate of the NMOS M11 can be connected to the second signal eni_bar of the input signal in.

The level switching circuit 32 can further include an NMOS M12 configured to promptly pull down the level of the enabling signal output node eni_rr when the power supply pwrin has a normal voltage VCC and the input signal in is in the low level. In an example, the substrate of the NMOS M12 is connected to the disabling signal providing node nrail, both the gate and the drain of the NMOS M12 are connected to the source of the NMOS M11 and to the resistor R3, and the source of the NMOS M12 is connected to a power supply ground pwrn.

FIG. 3 illustrates generally a circuit for controlling a Rail-to-Rail enabling signal including a level switching circuit 32 configured to receive a first signal eni of an input signal in, to perform enabling control according to high and low levels of the first signal eni, and to output a disabling signal in case of a power supply pwrin failure. The level switching circuit 32 can include a PMOS M10 and a resistor R3, wherein the PMOS M10 is configured to receive first signal eni of input signal in at a drain and can control the PMOS M10 to be in a state of on or off according to high and low levels of the first signal eni, wherein the first signal eni is in the low level in case of a power supply pwrin failure. The resistor R3 is configured to enable an enabling signal output node eni_rr to output an enabling signal while the PMOS M10 is on and to enable the enabling signal output node eni_rr to output a disabling signal during the PMOS M10 is off.

An example specific connection relation of the PMOS M10 and resistor R3 follows. The substrate of the PMOS M10 is connected to the power supply pwrin, the drain of the PMOS M10 is connected to the first signal eni of the input signal in, a source of the PMOS M10 is connected to the resistor R3, and a gate of the PMOS M10 is connected to a power supply ground pwrn. The resistor R3 is between the source of the PMOS M10 and a disabling signal providing node nrail and the level of the disabling signal providing node nrail is no higher than the power supply ground pwrn;

FIG. 4 illustrates generally an example level switching circuit 32, such as illustrated in FIG. 3, further including an NMOS M11 configured to receive a second signal eni_bar of the input signal in at its source and configured to control the NMOS M11 in an on state and to limit the current through the resistor R3 when the power supply pwrin either has a normal voltage or is down. In an example, the NMOS M11 is arranged between the PMOS M10 and the resistor R3, and the substrate of the NMOS M11 is connected to a disabling signal providing node nrail, the drain of the NMOS M11 is connected to the source of the PMOS M10, the source of the NMOS M11 is connected to the resistor R3, and the gate of the NMOS M11 is connected to the second signal eni_bar of the input signal in.

The level switching circuit 32 can include an NMOS M12 configured to promptly pull down the level of the enabling signal output node eni_rr when the power supply pwrin has a normal voltage VCC and the input signal in is in the low level. The substrate of the NMOS M12 can be connected to the disabling signal providing node nrail, both the gate and the drain of the NMOS M12 can be connected to the source of the NMOS M11 and to the resistor R3, and the source of the NMOS M12 can be connected to a power supply ground pwrn.

As illustrated in FIG. 3, the circuit for controlling a Rail-to-Rail enabling signal can include a buffer 31 configured to acquire the first signal eni of the input signal in and to feed the first signal eni to the drain of the PMOS M10 of the level switching circuit 32. As illustrated in FIG. 4, the buffer 31 can further be configured to acquire the second signal eni_bar of the input signal in and feed the second signal eni_bar to the gate of the NMOS M11 of the level switching circuit 32.

Figure 5:
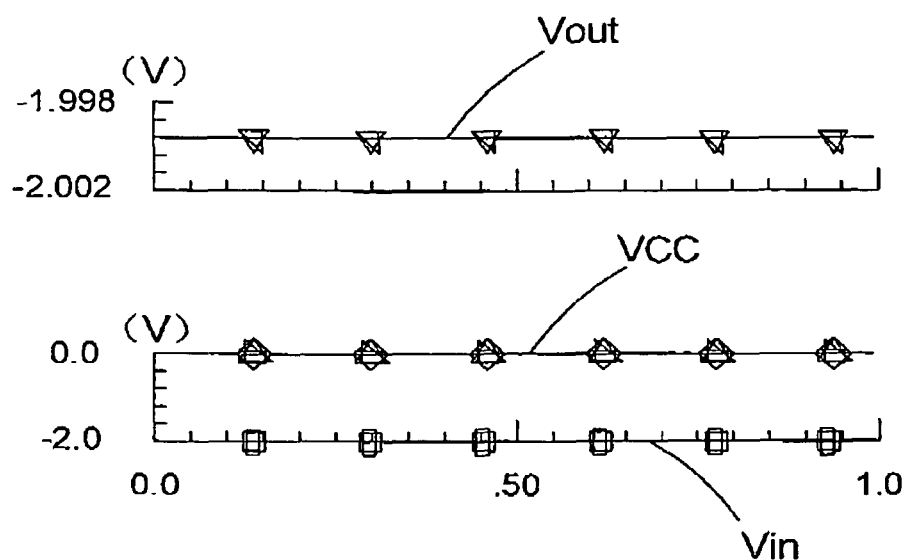
FIG. 5 is a schematic view of a simulation test of a circuit for controlling a pair of Rail-to-Rail enabling signals according to the present disclosure.
Figure 6:
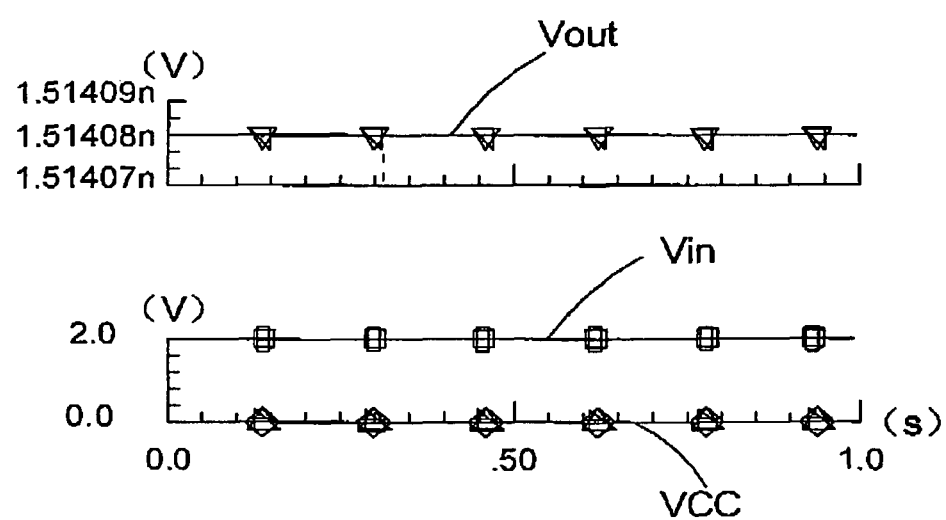
FIG. 6 is a schematic view of a simulation test of a circuit for controlling another pair of Rail-to-Rail enabling signals according to the present disclosure.

FIGS. 5 and 6 illustrate generally simulation tests for an example circuit for controlling a Rail-to-Rail enabling signal described herein, such as illustrated in FIG. 4, wherein the example circuit can output a disabling signal at all times, providing an accurate enabling control signal for an equipment operated under the control of the enabling control.

FIG. 5 illustrates generally a power supply voltage VCC=0V, an input signal Vin=−2V, a disabling signal providing node nrail of Vnrail=−2V, detection being done 6 times within 1 s, and an output disabling signal Vout=Vnrail=−2V.

FIG. 6 illustrates generally a power supply voltage VCC=0V, an input signal Vin=2V, a disabling signal providing node nrail of Vnrail=0V, detection being done 6 times within 1 s, and all output disabling signals are Vout=Vnrail=1.51408 nV≈0V.

What being described above are merely preferred embodiments of the disclosure and are not intended to limit the scope of the disclosure.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A level switching circuit, comprising:
    a Positive Channel Metal-Oxide-Semiconductor Field-Effect Transistor (PMOS) (M10) including a gate, a drain, a source, and a substrate, wherein the PMOS (M10) is configured to receive, at the drain of the PMOS M10, a first buffered input signal; and
    a resistor (R3) configured to enable an enabling signal output node to output an enabling signal when the PMOS (M10) is on and to enable the enabling signal output node to output a disabling signal when the PMOS (M10) is off,
    wherein the source of the PMOS (M10) is directly coupled to the resistor (R3),
    wherein the PMOS (M10) is configured to be in a state of on or off according to a high level or a low level of the first buffered input signal, and
    wherein, at failure of a power supply, the first buffered input signal is in the low level.

2. The level switching circuit of claim 1, wherein the substrate of the PMOS (M10) is configured to be coupled to the power supply,
    wherein the gate of the PMOS (M10) is configured to be coupled to a power supply ground, and
    wherein the resistor (R3) is coupled between the source of the PMOS (M10) and a disabling signal providing node providing the disabling signal.

3. The level switching circuit of claim 1, including:
    a Negative Channel Metal-Oxide-Semiconductor Field-Effect Transistor (NMOS) (M11) including a gate, a drain, a source, and a substrate,
    wherein the NMOS (M11) is configured to be in an on state and is configured to limit current through the resistor (R3) when the power supply has a normal voltage or at failure of the power supply,
    wherein the NMOS (M11) is coupled between the PMOS (M10) and the resistor (R3), wherein the substrate of the NMOS (M11) is connected to the disabling signal providing node, wherein the drain of the NMOS (M11) is connected to the source of the PMOS (M10), wherein the source of the NMOS (M11) is connected to the resistor (R3), and wherein the gate of the NMOS (M11) is connected to a second buffered input signal.

4. The level switching circuit of claim 3, including:
an NMOS (M12) including a gate, a drain, a source, and a substrate, wherein the NMOS (M12) is configured to pull down the level of the enabling signal output node when the power supply has a normal voltage and the input signal is in the low level, and wherein the substrate of the NMOS (M12) is connected to the disabling signal providing node, wherein the gate and the drain of the NMOS (M12) are both connected to the source of the NMOS (M11) and to the resistor (R3), and wherein the source of the NMOS (M12) is connected to a power supply ground.

5. A circuit for controlling a Rail-to-Rail enabling signal, comprising:
a level switching circuit configured to receive a first buffered input signal, to perform enabling control according to a high level and a low level of the first buffered input signal, and to output a disabling signal in case of a failure of a power supply coupled to the level switching circuit, the level switching circuit including:
a Positive Channel Metal-Oxide-Semiconductor Field-Effect Transistor (PMOS) (M10) including a gate, a drain, a source, and a substrate, wherein the PMOS (M10) is configured to receive, at the drain of the PMOS M10, the first buffered input signal, wherein the gate of the PMOS (M10) is configured to be directly coupled to a power supply ground.

6. The circuit for controlling the Rail-to-Rail enabling signal of claim 5, wherein the level switching circuit includes:
a resistor (R3) configured to enable an enabling signal output node to output an enabling signal when the PMOS (M10) is on and to enable the enabling signal output node to output a disabling signal when the PMOS (M10) is off, wherein the PMOS (M10) is configured to be in a state of on or off according to a high level or a low level of the first buffered input signal, and wherein, at failure of a power supply, the first buffered input signal is in the low level.

7. The circuit for controlling the Rail-to-Rail enabling signal of claim 6, wherein the substrate of the PMOS (M10) is configured to be coupled to the power supply, wherein the source of the PMOS (M10) is coupled to the resistor (R3), and wherein the resistor (R3) is coupled between the source of the PMOS (M10) and a disabling signal providing node providing the disabling signal.

8. The circuit for controlling the Rail-to-Rail enabling signal of claim 6, including a buffer configured to acquire the input signal and to provide the buffered input signal to the drain of the PMOS (M10).

9. The circuit for controlling the Rail-to-Rail enabling signal of claim 8, wherein the level switching circuit includes:
a Negative Channel Metal-Oxide-Semiconductor Field-Effect Transistor (NMOS) (M11) including a gate, a drain, a source, and a substrate, wherein the NMOS (M11) is configured to be in an on state and is configured to limit current through the resistor (R3) when the power supply has a normal voltage or at failure of the power supply, wherein the NMOS (M11) is coupled between the PMOS (M10) and the resistor (R3), wherein the substrate of the NMOS (M11) is connected to the disabling signal providing node, wherein the drain of the NMOS (M11) is connected to the source of the PMOS (M10), wherein the source of the NMOS (M11) is connected to the resistor (R3), and wherein the gate of the NMOS (M11) is connected to a second buffered input signal.

10. The circuit for controlling the Rail-to-Rail enabling signal of claim 9, wherein the level switching circuit includes:
an NMOS (M12) including a gate, a drain, a source, and a substrate, wherein the NMOS (M12) is configured to pull down the level of the enabling signal output node when the power supply has a normal voltage and the input signal is in the low level, and wherein the substrate of the NMOS (M12) is connected to the disabling signal providing node, wherein the gate and the drain of the NMOS (M12) are both connected to the source of the NMOS (M11) and to the resistor (R3), and wherein the source of the NMOS (M12) is connected to a power supply ground.

11. The circuit for controlling the Rail-to-Rail enabling signal of claim 9, wherein the buffer is configured to acquire the second signal and to provide a representation of the second signal to the gate of the NMOS (M11).

12. A method for controlling a Rail-to-Rail enabling signal, comprising:
providing a first buffered input signal of a control circuit to a drain of a Positive Channel Metal-Oxide-Semiconductor Field-Effect Transistor (PMOS) (M10) in a level switching circuit, wherein the gate of the PMOS (M10) is configured to be directly coupled to a power supply ground;

performing, by the level switching circuit, enabling control according to a high level and a low level of the first buffered input signal; and outputting, by the level switching circuit, a disabling signal in case of a failure of a power supply coupled to the level switching circuit.

13. The method for controlling the Rail-to-Rail enabling signal of claim 12, wherein the providing the first buffered input signal includes:
acquiring an input signal via a buffer connected to the level switching circuit.

14. The method for controlling the Rail-to-Rail enabling signal of claim 13, wherein the acquiring the input signal includes:
receiving, by an input of a phase inverter (op1) in the buffer, the input signal, wherein the phase inverter (op1) includes an output connected to an input of a phase inverter (op2) in the buffer, and wherein the phase inverter (op2) includes an output connected to the drain of the PMOS (M10) of the level switching circuit.

15. The method for controlling the Rail-to-Rail enabling signal according to claim 13, wherein the performing, by the level switching circuit, enabling control according to a high level and a low level of the first buffered input signal includes:

turning the PMOS (M10) on and outputting, by an enabling signal output node, an enabling signal, when the power supply has a normal voltage VCC, the input signal is high, and the first buffered input signal provided to the drain of the PMOS (M10) is high; and turning the PMOS (M10) off, pulling down the level of the enabling signal output node to the level Vnrail of a disabling signal providing node providing the disabling signal via a resistor (R3) in the level switching circuit, and outputting, by the enabling signal output node, the disabling signal, when the power supply has the normal voltage VCC, the input signal is low, and the first buffered input signal provided to the drain of the PMOS (M10) is low.

16. The method for controlling the Rail-to-Rail enabling signal of claim 13, wherein the outputting, by the level switching circuit, a disabling signal in case of a failure of a power supply includes:

turning the PMOS (M10) off, pulling down the level of the enabling signal output node to the level Vnrail of a disabling signal providing node providing the disabling signal via a resistor (R3) in the level switching circuit, and outputting, by the enabling signal output node, the disabling signal when the power supply fails, the buffer stops operating, and the first buffered input signal provided to the drain of the PMOS (M10) is low.

17. The method for controlling the Rail-to-Rail enabling signal of claim 13, including:

providing a second buffered input signal to the level switching circuit; and performing, by the level switching circuit, enabling control according to high and low levels of the first and the second buffered input signals.

18. The method for controlling the Rail-to-Rail enabling signal of claim 17, wherein the providing the second buffered input signal to the level switching circuit includes:

acquiring the second buffered input signal via the buffer; and providing the second buffered input signal to a gate of an NMOS (M11) in the level switching circuit.

19. The method for controlling the Rail-to-Rail enabling signal of claim 18, wherein the performing, by the level switching circuit, enabling control according to high and low levels of the first and the second buffered input signals includes:

turning both the PMOS (M10) and the NMOS (M11) on and outputting, by an enabling signal output node, an enabling signal when the power supply has a normal voltage VCC, the input signal is high, the first buffered input signal provided to the drain of the PMOS (M10) is high, and the second buffered input signal provided to the gate of the NMOS (M11) is low; and turning the PMOS (M10) off and the NMOS (M11) on, pulling down the level of the enabling signal output node to the level Vnrail of a disabling signal providing node providing the disable signal via a resistor (R3) in the level switching circuit, and outputting, by the enabling signal output node, the disabling signal when the power supply has the normal voltage VCC, the input signal is low, the first buffered input signal provided to the drain of the PMOS (M10) is high, and second buffered input signal provided to the gate of the NMOS (M11) is low.

20. The method for controlling the Rail-to-Rail enabling signal of claim 18, wherein the outputting, by the level switching circuit, a disabling signal in case of the failure of the power supply failure includes:

turning the PMOS (M10) off and the NMOS (M11) on, pulling down the level of the enabling signal output node to the level Vnrail of a disabling signal providing node providing the disable signal via a resistor (R3), and outputting, by the enabling signal output node, the disabling signal when the power supply fails, the buffer stops operating, and both the first buffered input signal provided to the drain of the PMOS (M10) and the second buffered input signal provided to the gate of the NMOS (M11) are low.

21. The method for controlling the Rail-to-Rail enabling signal of claim 19, including:

arranging an NMOS (M12) in the level switching circuit, and pulling down the level of the enabling signal output node via the NMOS (M12) when the power supply has the normal voltage VCC and the input signal is low.

* * * * *